United States Patent [19]

Hansch

[11] 4,152,537
[45] May 1, 1979

[54] ELECTRICITY GENERATOR

[76] Inventor: Ronald V. Hansch, 203 NE. 113, Portland, Oreg. 97220

[21] Appl. No.: 850,903

[22] Filed: Nov. 14, 1977

[51] Int. Cl.$^2$ ............................................. H01L 35/28
[52] U.S. Cl. .................................... 136/208; 136/224; 310/306; 322/2 R
[58] Field of Search ................ 136/208, 224; 310/306; 322/2 R

[56] References Cited

U.S. PATENT DOCUMENTS

| 3,339,077 | 8/1967 | Shapiro | 310/306 X |
|---|---|---|---|
| 3,365,653 | 1/1968 | Gabor et al. | 310/306 X |
| 3,381,201 | 4/1968 | Angello | 310/306 X |
| 3,402,074 | 9/1968 | Chapman et al. | 310/306 X |
| 3,430,079 | 2/1969 | Danko et al. | 136/208 X |

FOREIGN PATENT DOCUMENTS 874660 8/1961 United Kingdom .................... 136/208

Primary Examiner—Leland A. Sebastian
Attorney, Agent, or Firm—Howard I. Podell

[57] ABSTRACT

An electricity generator which produces electrical energy from the random Brownian movement of molecules in a gas, and the uneven distribution of thermal energy in the different molecules of the gas, which is at an overall average uniform temperature. A plurality of sets of thermocouples are mounted on a surface in direct contact with the atmosphere, or a gas in a reservoir, with each thermocouple set consisting of a junction of molecular size of two dissimilar metals, and with each thermocouple set joined through a rectifier a similar thermocouple set. Alternatively, a plurality of separate molecular size metal anodes may be mounted on a surface with pairs of anodes converted by rectifiers to the output circuit.

3 Claims, 4 Drawing Figures

# ELECTRICITY GENERATOR

BACKGROUND OF THE INVENTION

Thermo-electric generators utilizing junction of dissimilar metals are well known in the art and are successfully employed to produce electricity where two such connected junctions are maintained at a temperature differential. Such generators are disclosed in U.S. Pat. Nos. 3,365,653; 3,495,101; 2,979,551; 3,609,593; 3,252,013; and 3,508,089.

Such thermo-electric generators have been employed for measurement of temperature and for production of electricity, but the power output of such conventional generators has been a small fraction of the energy required to maintain the junctions at the required temperature differentiated.

Physicists are also aware of the fact that in a chamber of a gas maintained at a uniform average temperature, the individual gas molecules are each moving at different velocities and with thermal energy of each molecule being proportionate to its velocity.

By means of my invention electric power may be generated by use of thermocouple junctions of molecular size which generate electricity from the difference in thermal energy of two different molecules that simultaneously strike two such thermocouple junctions.

SUMMARY OF THE INVENTION

My invention is an electricity generator which produces electrical energy from the random Brownian movement of molecules in a gas or fluid, and the uneven distribution of thermal energy in the different molecules of the gas or fluid, which is at an overall average uniform temperature. A plurality of sets of thermocouples are mounted on a surface in direct contact with the atmosphere, or a gas in a reservoir, with each thermocouple set consisting of a junction of molecular size of two dissimilar metals, and with each thermocouple set joined through a rectifier a similar thermocouple set. Alternatively, a plurality of separate molecular size metal anodes may be mounted on a surface with pairs of anodes converted by rectifiers to the output circuit.

In my invention, pairs of sets of molecular-size thermocouple junctions are joined through rectifiers to a common pair of electric power output conductors, so that electricity always flows between such joined pairs when one of the junctions is struck by a gas molecule of higher energy than that striking the other junction of the pair. Such an electricity flow between the paired junctions is in random order and direction when both junctions of a pair are exposed to a gas, dependent upon the random Brownian motion of the molecules of the gas. However the rectifiers of my invention transform the random flow of electricity to a uni-directional flow of electricity in the output electric power conductors. As a consequence, the thermal energy of the gas is converted to electricity and with consequent cooling of the average temperature of the gas.

Alternatively, pairs of sets of molecular size metal anodes, fixed to a surface, are connected by a rectifier to the output power conductors, with the anodes formed of metal that accepts or ejects electrons to or from a gas depending on thermal energy of a gas molecule that strikes the anode.

BRIEF DESCRIPTION OF THE DRAWINGS

The objects and features of the invention may be understood with reference to the following detailed description of an illustrative embodiment of the invention, taken together with the accompanying drawings in which.

DESCRIPTION OF THE PREFERRED EMBODIMENT

Figure 1:
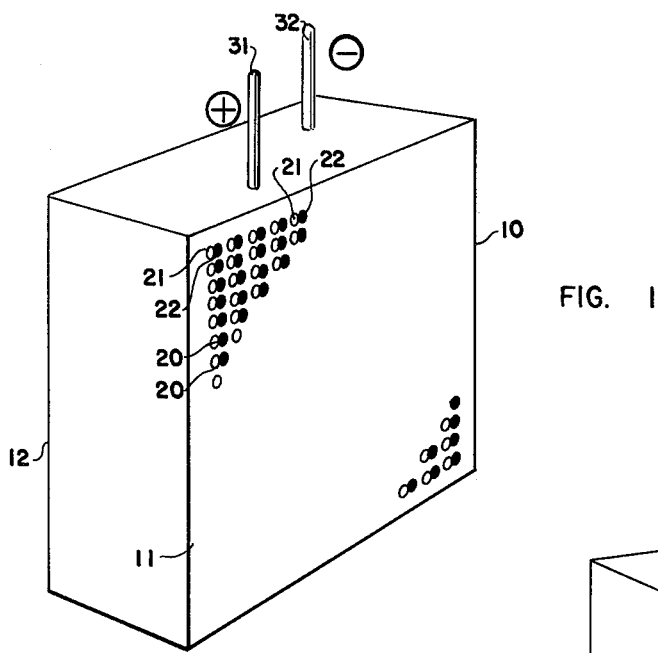
FIG. 1 is a perspective view of a thermocouple plate.
Figure 2:
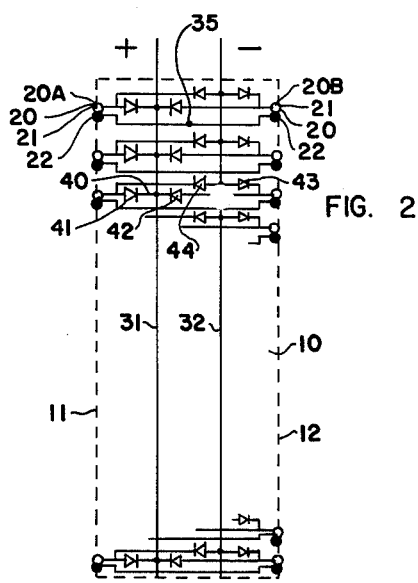
FIG. 2 is a schematic drawing of the electric circuit.

Turning now descriptively to the drawings, in which similar reference characters denote similar elements throughout the several views, FIGS. 1-2 illustrate the invention in the form of a plate 10, on an outer surface 11 of which are mounted a plurality of thermocouple junctions 20, each of molecular size and each connected through a rectifier bridge to a similar thermocouple junction 20 on the opposed surface 12, with each rectifier bridge connected to a pair of electrical output conductors 31, 32.

Each thermocouple junction 20 is formed of an exposed electrode 21 of a first metal in abutting electrical contact with a similar electrode 22 formed of a second metal, and with the two metals of different electromotive properties such as iron and copper. It is well known in the art that if one such junction 20 is connected in parallel with a second such junction 20, by connecting the respective electrodes 21 to each other and connecting the respective electrodes 22 to each other, a direct electrical current will flow in the circuitry if the two junctions are maintained at a temperature differential, since each junction generates a voltage that is proportioned to its temperature. It is a feature of my invention to produce a flow of electricity in conductors 31, 32 when the surfaces 11, 12 are both exposed to a gas at a uniform average temperature.

Rectifiers 41-44 of rectifier bridge 40 serves to direct any random reciprocal flow of electricity between the two electrodes 21 of the two joined junctions 20A, 20B so that a direct current flow of electricity is produced in conductors 31, 32 with the two electrodes 22 joined by a common wire 35.

Since junctions 20A and 20B are of microscopic size, approaching the size of the molecules of gas surrounding plate 10, they are each subject to impact with gas molecules, each of varying thermal energy. At those times when both junctions 20A and 20B are simultaneously struck by gas molecules of equal thermal energy, there will be no difference of temperature of the junctions 20A, 20B and no electrocurrent will flow in common wire 35 or rectifier bridge 40.

However, at those instants when the two junctions are struck by gas molecules possessing different thermal energies, one of the junctions will be instantaneously heated to a higher temperature than the other to produce a voltage differential between the junctions 20A, 20B resulting in a transient flow of electric current through common wire 35 and rectifier bridge 40. Regardless of the direction of current flow between junctions 20A and 20B the rectifier bridge conducts the transient current so as to maintain output conductor 31 positive and output conductor 32 negative.

The thermocouple junctions 20, rectifier bridge 40 and the conductors in plate 10 may be produced by present microscopic integrated techniques. While junctions 20A and 20B are shown on opposite surfaces of plate 10, they may both be mounted on a common surface since the molecules of gas striking each side of the plate include molecules of assorted thermal energies despite the uniform average temperature of the gas.

Figure 3:
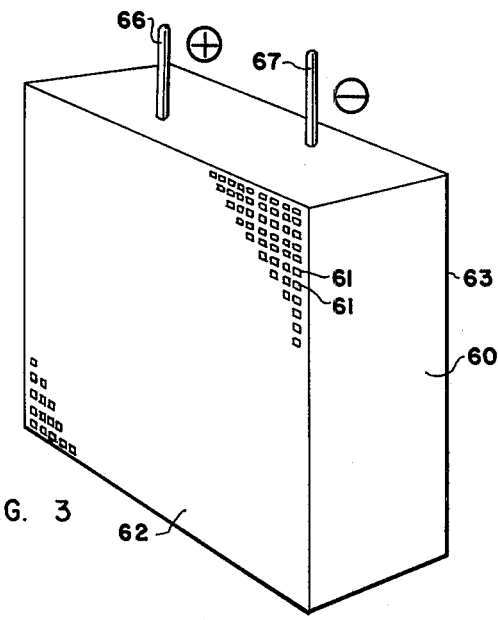
FIG. 3 is a perspective view of an anode plate.
Figure 4:
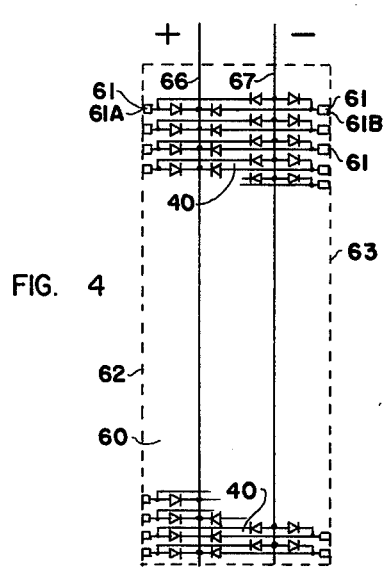
FIG. 4 is a schematic drawing of the electrical circuit of the anode plate.

FIGS. 3 and 4 illustrate an alternative embodiment of the invention. Plate 60 is formed with a plurality of individual metal electrodes 61 mounted on surfaces 62 and 63. Anodes 61 are each formed of a similar metal with properties of accepting electrons when bombarded by gas molecules of relatively high thermal energy and ejecting electrons when contacted by molecules of relatively low thermal energy. Each electrode 61A is joined by a rectifier bridge 40 to a paired electrode 61B and connected to a pair of output conductors 66, 67.

When the two electrodes 61A, 61B of a pair are simultaneously each contacted by an individual gas molecule, where both gas molecules are possessed of different thermal energy levels, a transient current will flow between the paired electrodes and through the rectifier bridge to charge output conductor 66 positively and conductor 67 negatively. Plate 60 may be employed in an atmosphere of reduced gas pressure and may be mounted in use in a gas reservoir at an average elevated temperature.

When output conductors 31, 32 or 66, 67 are connected to an electrical load the operation of plate 10 and plate 60 serve to both generate electricity and to cool the gas with which they are in contact.

Since obvious changes may be made in the specific embodiment of the invention described herein, such modifications being within the spirit and scope of the invention claimed, it is indicated that all matter contained herein is intended as illustrative and not as limiting in scope.

Having thus described the invention, what I claim as new and desire to secure by Letters Patent of the United States is:

1. A generator of electricity comprising a plurality of pairs of electrode units, with a rectifier unit joining each of the electrode units of a pair to each other and to a pair of power output conductors so that both electrode units of a pair may be exposed to a fluid at a uniform average temperature, said electrode units adaptable for generating electricity when the two electrode units of a pair are simultaneously exposed to molecules of said fluid which are at different levels of thermal energy with respect to each other at the two electrode units.

2. The combination as recited in claim 1 in which each electrode unit is a thermocouple junction.

3. The combination as recited in claim 1 in which the rectifier unit is a full wave rectifier so as to convert transient electric currents between the two electrode units into a direct current output.

* * * * *